United States Patent [19]
Nakagawa et al.

[11] Patent Number: 6,091,347
[45] Date of Patent: Jul. 18, 2000

[54] DEVICE AND METHOD FOR MODULATION AND TRANSMISSION MEDIUM

[75] Inventors: Toshiyuki Nakagawa; Tatsuya Narahara; Yoshihide Shinpuku, all of Kanagawa, Japan

[73] Assignee: Sony Corporation, Tokyo, Japan

[21] Appl. No.: 09/078,162

[22] Filed: May 13, 1998

[30] Foreign Application Priority Data

May 23, 1997 [JP] Japan ................................. 9-133379
Sep. 22, 1997 [JP] Japan ................................. 9-256745

[51] Int. Cl.[7] ................................................. H03M 7/00
[52] U.S. Cl. ............................... 341/59; 341/58; 341/102
[58] Field of Search ................................ 341/58, 59, 102, 341/67

[56] References Cited

U.S. PATENT DOCUMENTS

| | | | |
|---|---|---|---|
| 5,025,256 | 6/1991 | Stevens | 341/59 |
| 5,062,152 | 10/1991 | Faulkner | 341/59 |
| 5,355,133 | 10/1994 | Shimpuku et al. | 341/58 |
| 5,400,023 | 3/1995 | Ino et al. | 341/59 |
| 5,600,315 | 2/1997 | Shimpuku et al. | 341/59 |

FOREIGN PATENT DOCUMENTS

| | | |
|---|---|---|
| 0 744 838 | 11/1996 | European Pat. Off. . |
| 0 902 544 | 3/1999 | European Pat. Off. . |
| 0 903 864 | 3/1999 | European Pat. Off. . |
| 0 923 077 | 6/1999 | European Pat. Off. . |
| WO 94 18670 | 8/1994 | WIPO . |

*Primary Examiner*—Howard L. Williams
*Assistant Examiner*—Jean B. Jeanglaude
*Attorney, Agent, or Firm*—Frommer Lawrence & Haug, LLP.; William S. Frommer

[57] ABSTRACT

Clock is reproduced stably. If data (limiting code) containing a plurality of consecutive minimum inversion interval Tmin is contained in the data inputted from a shift register, a Tmin consecution limiting code detection unit detects such consecutive interval. A constraint length judgement unit judges the constraint length i to be the constraint length corresponding to the code for limiting the constraint length i when a detection signal is inputted from the Tmin consecution limiting code detection unit, and outputs the judged constant length to a multiplexer. The multiplexer selects the output of a converter corresponding to the constraint length supplied from the constraint length judgement unit out of converters 14-1 to 14-r, and supplies the selected output to a run detection processing unit through a buffer.

25 Claims, 14 Drawing Sheets

FIG. 5

| A | B | C |
|---|---|---|
| 0 | 0 | 0 |
| 0 | 1 | 1 |
| 1 | 0 | 0 |
| 1 | 1 | 0 |

FIG. 6

```
         i=2         i=1              i=1         i=2
DATA    00  10    01  10    01    10    01   00  10
CODE A  000 010   10x 01⌐   10x   01⌐   10x  000 010
CODE B  000 010   10x 010   000   010   10x  000 010
         i=2         i=1         i=3         i=1    i=2
```

FIG. 8

| DATA | 01 | | 10 | | 01 | 10 | |
|---|---|---|---|---|---|---|---|
| CODE A | x01 | | 010 | x01 | x01 | 010 | ... |
| CODE B | x01 | | 010 | 000 | 001 | 010 | ... |
| | i=1 | | i=3 | | i=1 | | |

FIG. 9

| DATA | 00 | 01 | | 10 | 01 | | 10 | 01 | | 10 | |
|---|---|---|---|---|---|---|---|---|---|---|---|
| CODE A | 00x | 010 | | 10x | 010 | | 10x | 010 | | 10x | ... |
| CODE B | 00x | 010 | 100 | 000 | 010 | 010 | 010 | 010 | | 10x | ... |
| | i=1 | | i=3 | | i=1 | | | i=2 | | | |

FIG. 10

| | i=1 | i=1 | | i=3 | | | i=1 | i=1 |
|---|---|---|---|---|---|---|---|---|
| DATA | 00 | 01 | 10 | 01 | 10 | 01 | 10 | ... |
| CODE A | x00 | 010 | x01 | 010 | x01 | 010 | x01 | ... |
| CODE B | x00 | 010 | 010 | 000 | 001 | 010 | x01 | ... |

FIG. 11

| | i=1 | i=1 | | i=3 | | | i=1 | i=1 |
|---|---|---|---|---|---|---|---|---|
| DATA | 11 | 10 | 01 | 10 | 01 | 10 | 01 | ... |
| CODE A | 00x | 010 | 10x | 010 | 10x | 010 | 10x | ... |
| CODE B | 00x | 010 | 100 | 000 | 010 | 010 | 10x | ... |

FIG. 12

|  | i=2 |  | i=1 |  |  |  |  |
|---|---|---|---|---|---|---|---|
| DATA | 00 | 10 | 01 | 10 | 01 | 10 | 01 | ⋮ |
| CODE A | 000 | 010 | 10x | 010 | 10x | 010 | 10x | ⋮ |
| CODE B | 000 | 010 | 100 | 000 | 001 | 00x | 10x | ⋮ |
|  |  |  | i=4 |  |  | i=2 | i=1 |  |

FIG. 13

|  | i=1 |  |  | i=1 |  |  |  |
|---|---|---|---|---|---|---|---|
| DATA | 01 | 10 | 11 | 10 | 11 | 10 | 11 | ⋮ |
| CODE A | 00x | 010 | 10x | 010 | 10x | 010 | 10x | ⋮ |
| CODE B | 00x | 001 | 000 | 000 | 100 | 010 | 010 | 10x | 10x | ⋮ |

RML(1,6)

RML(1,6)   i=1

| DATA   | 01  | 10  | 11  | 10  | 11  | 10  | 11  |
|--------|-----|-----|-----|-----|-----|-----|-----|
| CODE A | x00 | 010 | x01 | 010 | x01 | 010 | x01 |
| CODE B | x00 | 010 | 001 | 000 | 000 | 100 | x01 | 010 | x01 | i=1    i=5    i=1

FIG. 15

RML(1,6)   i=1

| DATA   | 01  | 10  | 11  | 10  | 11  | 10  | 11  |
|--------|-----|-----|-----|-----|-----|-----|-----|
| CODE A | 00x | 010 | 10x | 010 | 10x | 010 | 10x |
| CODE B | 00x | 001 | 000 | 000 | 100 | 10x | 010 | 10x | i=1    i=6    i=1

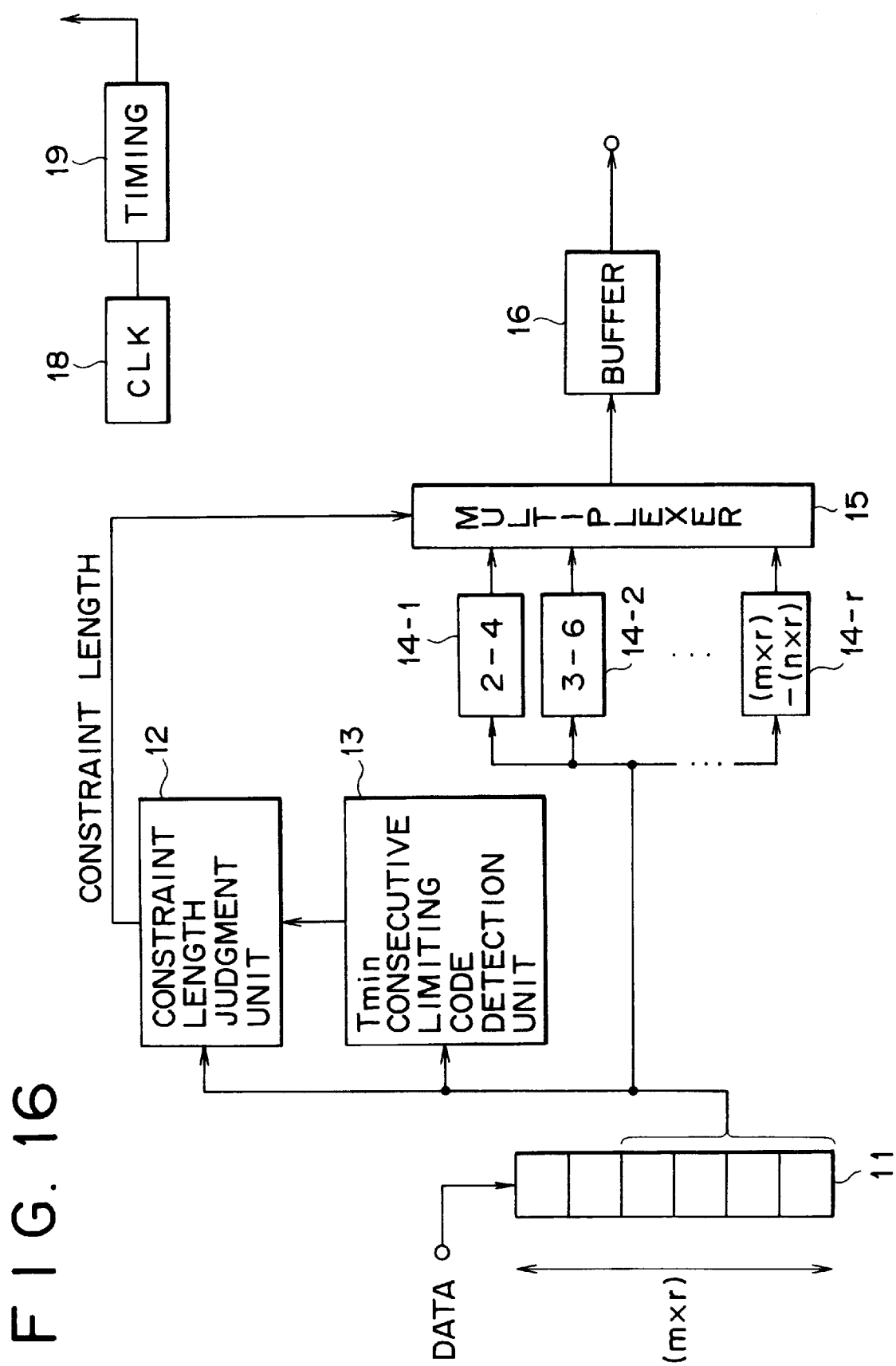
F I G. 16

FIG. 18

FOR RLL (2-7)

| | | | | | |
|---|---|---|---|---|---|
| DATA | 010 | 010 | 010 | 010 | ... 3T OR Tmin CONTINUES INFINITELY |
| CODE A | 100 100 | 100 100 | 100 100 | 100 100 | ... |
| | i=2 | | | | |

FOR RML (2-7)

| | | | | |
|---|---|---|---|---|
| DATA | 0 1 0 0 1 | 0 0 1 0 | 0 1 0 | ... 3T CONTINUES LIMITEDLY |
| CODE B | 00 00 10 01 00 | 00 10 01 00 | 10 01 00 | ... |
| | i=4 | i=3 | i=2 | |

F I G. 19

FOR VFM

| DATA | 10 | 10 | 10 | 10 | 10 | 10 | ... | 5T OR Tmin CONTINUES INFINITELY |
|---|---|---|---|---|---|---|---|---|
| CODE A | 10000 | 10000 | 10000 | 10000 | 10000 | 10000 | ... | |

FOR RML-VFM

| DATA | 10 | 10 | 10 | 10 | 10 | 10 | ... | 5T CONTINUES LIMITEDLY |
|---|---|---|---|---|---|---|---|---|
| CODE B | 00001 | 00001 | 00001 | 00001 | 00001 | 00001 | ... | |

DEVICE AND METHOD FOR MODULATION AND TRANSMISSION MEDIUM

BACKGROUND OF THE INVENTION

1. Field of the Invention

This invention relates to a device and method for modulation and transmission medium, and more particularly relates to a device and method for modulation and transmission medium for modulating data to data suitable for data transmission and recording in recording media.

2. Description of Related Art

Usually data are modulated to data suitable for transmission and recording when the data are transmitted to a prescribed transmission line or recorded in a recording medium such as an optical disc or a magneto-optic disc. Block coding has been known as one of modulation methods. In the block coding, a data string is converted into blocks composed of units, each unit contains m×i bits (referred to as data word hereinafter), and the data word is converted further into code word composed of n×i bits according to a suitable code rule. The code word is a fixed-length code if i=1, and the code word is a variable-length code if i is selected from a plurality of numbers, that is, the code word is converted with selection of a prescribed i in a range from 1 to imax (maximum of i). The block coded code is represented as variable-length code (d, k; m, n; r).

The i is referred to as constraint length, and the imax is referred to as r (maximum constraint length). The minimum run d indicates the minimum consecutive number of "0" inserted in a consecutive "1" in a code sequence, and the maximum run k indicates the maximum consecutive number of "0" inserted in a consecutive "1" in a code sequence.

In a compact disc and minidisc (trademark), in the processing of the variable-length code obtained as described herein above, NRZI (Non Return to Zero Inverted) modulation in which "1" indicates inversion and "0" indicates non-inversion is performed, and NRZI-modulated variable-length code (referred to as record waveform string hereinafter) is recorded.

The minimum inversion interval of the record waveform string is represented by Tmin, and the maximum inversion interval is represented by Tmax. The longer minimum inversion interval Tmin namely the larger minimum run d is desirable for higher density recording in linear velocity direction, on the other hand, the shorter maximum inversion interval Tmax namely the smaller maximum run k is desirable in the view point of reproduction of the clock, various methods for modulation have been proposed.

In detail, for example, RLL (2–7) has been known as a method for modulation used for magnetic disks or magneto-optic discs. The parameter of this modulation method is (2, 7; 1, 2; 3), and the bit interval of the record waveform string is represented by T, then the minimum inversion interval Tmin (=(d+1)T) is 3 (=2+1)T. The bit interval of the data string is represented by Tdata, then the minimum inversion interval Tmin is 1.5 (=(m/n)×Tmin=(½)×3)Tdata. The maximum inversion interval Tmax (=(k+1)T) is 8 (=7+1)T(=(m/n)×Tmax)Tdata=(½)×8 Tdata=4.0 Tdata. The detection window width Tw (=(m/n)T) is 0.5 (=½)Tdata.

Alternatively, RLL (1–7) has been known as a modulation method used also for magnetic disks or magneto-optic discs. The parameter of this modulation method is (1, 7; 2, 3; 2), the minimum inversion interval Tmin is 2 (=1+1)T (=(⅔)×2 Tdata=1.33 Tdata). The maximum inversion interval Tmax is 8 (=7+1) T (=⅔)×8 Tdata=5.33 Tdata). The detection window width Tw is 0.67 (=⅔)Tdata.

In comparison between RLL (2–7) and R (1–7), RLL (2–7) namely the minimum inversion interval Tmin of 1.5 Tdata is more desirable than RLL (1–7) namely 1.33 Tdata for higher density recording in the linear velocity direction, for example, in a magnetic disk system and magneto-optic disc system. However, RLL (1–7) which is said to have larger detection window width Tw and larger jitter tolerance than RLL (2–7) is actually used more popularly.

An example of RLL (1–7) conversion table is shown herein under.

TABLE 1

RLL (1, 7; 2, 3; 2)

|  | data | code |
|---|---|---|
| i = 1 | 11 | 00x |
|  | 10 | 010 |
|  | 01 | 10x |
| i = 2 | 0011 | 000 00x |
|  | 0010 | 000 010 |
|  | 0001 | 100 00x |
|  | 0000 | 100 010 | x in the conversion table is converted to 1 if the subsequent channel bit is 0, or converted to 0 if the subsequent channel bit is 1 (the same is true hereinafter). The constraint length r is 2.

This code can be realized by inverting the order of each bit ranging from MSB to LSB as listed in the table shown herein under.

TABLE 2

RLL (1, 7; 2, 3; 2)

|  | data | code |
|---|---|---|
| i = 1 | 11 | x00 |
|  | 10 | 010 |
|  | 01 | x01 |
| i = 2 | 0011 | x00 000 |
|  | 0010 | 010 000 |
|  | 0001 | x00 001 |
|  | 0000 | 010 001 |

The constraint length r is 2.

Alternatively, the RLL (1–7) conversion table can be realized also by changing an array as described herein under.

TABLE 3

RLL (1, 7; 2, 3; 2)

|  | data | code |
|---|---|---|
| i = 1 | 00 | 00x |
|  | 01 | 010 |
|  | 10 | 10x |
| i = 2 | 1100 | 000 010 |
|  | 1101 | 000 00x |
|  | 1110 | 100 010 |
|  | 1111 | 100 00x |

The constraint length r is 2.

This code can be realized by inverting the order of each bit ranging from MSB to LSB as listed in the table shown herein under.

TABLE 4

RLL (1, 7; 2, 3; 2)

| | data | code |
|---|---|---|
| i = 1 | 00 | x00 |
| | 01 | 010 |
| | 10 | x01 |
| i = 2 | 1100 | 010 000 |
| | 1101 | x00 000 |
| | 1110 | 010 001 |
| | 1111 | x00 001 |

The constraint length r is 2.

Further, an example of the conversion table of RLL (1–6) having a reduced maximum inversion interval Tmax at the minimum run d=1 is shown herein under.

TABLE 5

RLL (1, 6; 2, 3; 4)

| | data | code |
|---|---|---|
| i = 1 | 11 | 10x |
| | 10 | 010 |
| | 01 | 00x |
| i = 2 | 0011 | 100 010 |
| | 0010 | 100 00x |
| | 0001 | 000 010 |
| i = 3 | 000011 | 000 001 010 |
| | 000010 | 000 001 00x |
| | 000001 | 100 000 010 |
| i = 4 | 00000011 | 000 001 000 010 |
| | 00000010 | 000 001 000 00x |
| | 00000001 | 101 000 000 10x |
| | 00000000 | 001 000 000 10x |

The constraint length r is 4.

This code is realized by inverting the order of each bit ranging from MSB to LSB as listed in the table shown herein under.

TABLE 6

RLL (1, 6; 2, 3; 4)

| | data | code |
|---|---|---|
| i = 1 | 11 | x01 |
| | 10 | 010 |
| | 01 | x00 |
| i = 2 | 0011 | 010 001 |
| | 0010 | x00 001 |
| | 0001 | 010 000 |
| i = 3 | 000011 | 010 100 000 |
| | 000010 | x00 100 000 |
| | 000001 | 010 000 001 |
| i = 4 | 00000011 | 010 000 100 000 |
| | 00000010 | x00 000 100 000 |
| | 00000001 | x01 000 000 101 |
| | 00000000 | x01 000 000 100 |

The constraint length r is 4.

In addition to the above-mentioned cases, an example conversion table of RLL (1–6) code having a reduced maximum inversion interval Tmax and worst error transmission of finite pit is listed in the table shown herein under.

TABLE 7

RLL (1, 6; 2, 3; 5)

| | data | code |
|---|---|---|
| i = 1 | 11 | 10x |
| | 10 | 010 |
| | 01 | 00x |
| i = 2 | 0011 | 100 010 |
| | 0010 | 100 00x |
| | 0001 | 000 010 |
| i = 3 | 000011 | 000 001 010 |
| | 000010 | 000 001 00x |
| | 000001 | 100 000 010 |
| i = 4 | 00000011 | 000 001 000 010 |
| | 00000010 | 101 000 000 10x |
| | 00000001 | 001 000 000 10x |
| i = 5 | 0000000011 | 101 000 000 100 010 |
| | 0000000010 | 101 000 000 100 00x |
| | 0000000001 | 001 000 000 100 010 |
| | 0000000000 | 001 000 000 100 00x |

The constraint length r is 5.

Table 7 is arranged so that error does not continue infinitely when pit shift error happens to occur and demodulated. Infinitely continuing error means that when once a pit error happens to occur at a certain point in a code string all the following data strings are not demodulated correctly.

The pit shift error means the error arising from shifting of "1" for indicating an edge forward or backward in a code string generated by modulating a data string.

In addition to the above-mentioned tables, an example of the conversion table of RLL (2–7) having the maximum inversion interval Tmax of 8T (maximum run of 7) at the minimum ran d=2 is listed in the table shown herein under.

TABLE 8

RLL (2, 7; 1, 2; 3)

| | data | code |
|---|---|---|
| i = 1 | 11 | 1000 |
| | 10 | 0100 |
| i = 2 | 011 | 001000 |
| | 010 | 100100 |
| | 000 | 000100 |
| i = 3 | 0011 | 00001000 |
| | 0010 | 00100100 |

Occurrence frequency of the channel bit string subjected to RLL (1–7) modulation is mostly Tmin namely 2T, and followed by 3T and subsequently by 4T. The case that the edge information occurs very often with a short period such as 2T or 3T is advantageous for clock reproduction, however, consecutive 2T results in distorted recording waveform because the waveform output of 2T is small and susceptible to defocus and tangential tilt. A record having consecutive minimum marks is susceptible to external disturbance such as noise in high linear density condition, and erroneous data reproduction occurs often.

RLL (1–7) is combined often with PRML (Partial Response Maximum Likelihood) to improve S/N in reproduction of high linear near density record. The method is used for Viterbi decoding of RF reproduction waveform which is equalized to, for example, PR (1, 1) or PR (1, 2, 1) to match the media characteristics. For example, the reproduction output which is desirable for equalization to PR (1, 1) is listed herein under.

```
1 0 1 0 1 0 1 0         (channel bit data string)
1 1 0 0 1 1 0 0         (after NRZI conversion)
    . . .
    1 1
     1 1
      -1 -1
       -1 -1
        1 1
         1 1
          1 -1
           . . .
. . . +2 0 -2 0 +2 0 . . .   (reproduction output)
```

The data after NRZI conversion is a level data, the value is a value which is different (0 or 1) from the immediately antecedent value (1 or 0) if a channel bit data is 1, on the other hand, the value (0 or 1) is the same as the immediately antecedent value (0 or 1). In this example, "11" is decoded if the value after NRZI conversion is 1, on the other hand, "−1−1" is decoded if the value after NRZI conversion is 0. When Tmin namely 2T is consecutive, the waveform is equalized so that this reproduction output is outputted. Generally, the higher is the liner density the longer the waveform interference is, and the waveform equalization becomes long like PR (1, 2, 2, 1) or PR (1, 1, 1, 1).

When the suitable waveform equalization is PR (1, 1, 1, 1) as the result of application of high linear density at the minimum run d=1, in view of consecutive Tmin namely 2T, the reproduction signal is shown herein under.

```
1 0 1 0 1 0 1 0 1 0     (channel bit data string)
1 1 0 0 1 1 0 0 1 1     (after NRZI conversion)
     . . .
     1 1 1 1
      1 1 1 1
       -1 -1 -1 -1
        -1 -1 -1 -1
         1 1 1 1
          1 1 1 1
           1 -1 -1 -1
            . . .
. . . 0 0 0 0 . . .     (reproduction output)
```

0 continues consecutively. This reproduction output indicates that no signal is outputted continuously after waveform equalization, therefore Viterbi decoding does not merge, therefore this situation results in unstable data reproduction and clock reproduction.

For example, when a data string before modulation is "10-01-10-01-10-. . ." of RLL (1, 7; 2, 3; 2) in Table 1, such channel bit data string is outputted.

A data string before modulation of "11-10-11-10-11-10-. . ." of RLL (1, 6; 2, 3; 4) in Table 5 results in the same.

A data string before modulation of "010-010-010-010-. . ." of RLL (2, 7; 1, 2; 3) in Table 8 results in the same.

In the case that high density recording is applied to a recording media such as magnetic disk, magneto-optic disc, or optical disc, when a code having a long minimum run such as RLL (1–7), RLL (1–6), RLL (2–7), or VFM code as a modulation code, reproduction output of Tmin of the record reproduction waveform at high liner density becomes small. Therefore, if the minimum inversion interval Tmin occurs consecutively, generation of a clock is affected adversely by the occurrence and by the external disturbance such as jitter, and errors is apt to occur, such problem is disadvantageous.

Similarly, in the case that PR (1, 1, 1, 1) equalization is performed using d=1 code under high linear density condition, a signal of consecutive 0 is outputted as a reproduction signal, Viterbi decode does not merge, and clock reproduction is affected adversely.

SUMMARY OF THE INVENTION

The present invention is accomplished in view of such problems, the object of the present invention is to stabilize the clock reproduction by adding a code for limiting consecutive repetition of the minimum inversion interval Tmin to a conventional modulation table such as RLL (1–7), RLL (1–6), and RLL (2–7).

In a modulation method according to one aspect of the present invention, the minimum run d is 1 or larger, a limiting code allocated additionally for limiting consecution length of the minimum run d in a channel bit string after conversion of a variable length code when the minimum run d continues consecutively for a prescribed consecution length.

A transmission medium according to this intention transmits a program for allocating a limiting code additionally for limiting consecution length of the minimum run d in a channel bit string after conversion of a variable length code with the minimum run d of 1 or larger when the minimum run d continues consecutively for a prescribed consecution length.

A modulation device according to the present invention is provided with a table for allocating a limiting code additionally for limiting consecution length of the minimum run d in a channel bit string after conversion of a variable length code with the minimum run d of 1 or larger when the minimum run d continues consecutively for a prescribe consecution length.

When the minimum run d continues for a prescribed consecutive length in the channel bit string after variable length code conversion, a limiting code for limiting the consecution length is allocated additionally.

BRIEF DESCRIPTION OF THE DRAWINGS

FIG. 5 is a diagram for describing the relation between respective units of the run detection processing unit shown in FIG. 1.

FIG. 6 is a diagram for describing limiting operation of consecutive repetition of the minimum inversion interval when a conversion table shown in Table 9 is used.

FIG. 8 is a diagram for describing limiting operation of consecutive repetition of the minimum inversion interval when a conversion table shown in Table 10 is used.

FIG. 9 is a diagram for describing limiting operation of consecutive repetition of the minimum inversion interval when a conversion table shown in Table 11 is used.

FIG. 10 is a diagram for describing limiting operation of consecutive repetition of the minimum inversion interval when a conversion table shown in Table 12 is used.

FIG. 11 is a diagram for describing limiting operation of consecutive repetition of the minimum inversion interval when a conversion table shown in Table 13 is used.

FIG. 12 is a diagram for describing limiting operation of consecutive repetition of the minimum inversion interval when a conversion table shown in Table 14 is used.

FIG. 13 is a diagram for describing limiting operation of consecutive repetition of the minimum inversion interval when a conversion table shown in Table 16 is used.

FIG. 14 is a diagram for describing limiting operation of consecutive repetition of the minimum inversion interval when a conversion table shown in Table 17 is used.

FIG. 15 is a diagram for describing limiting operation of consecutive repetition of the minimum inversion interval when a conversion table shown in Table 18 is used.

FIG. 16 is a block diagram for illustrating an exemplary structure of another embodiment of a modulation device of the present invention.

FIG. 18 is a diagram for describing limiting operation of consecutive repetition of the minimum inversion interval when a conversion table shown in Table 19 is used.

FIG. 19 is a diagram for describing limiting operation of consecutive repetition of the minimum inversion interval when a conversion table shown in Table 20 is used.

DETAILED DESCRIPTION OF THE PREFERRED EMBODIMENTS

Figure 1:
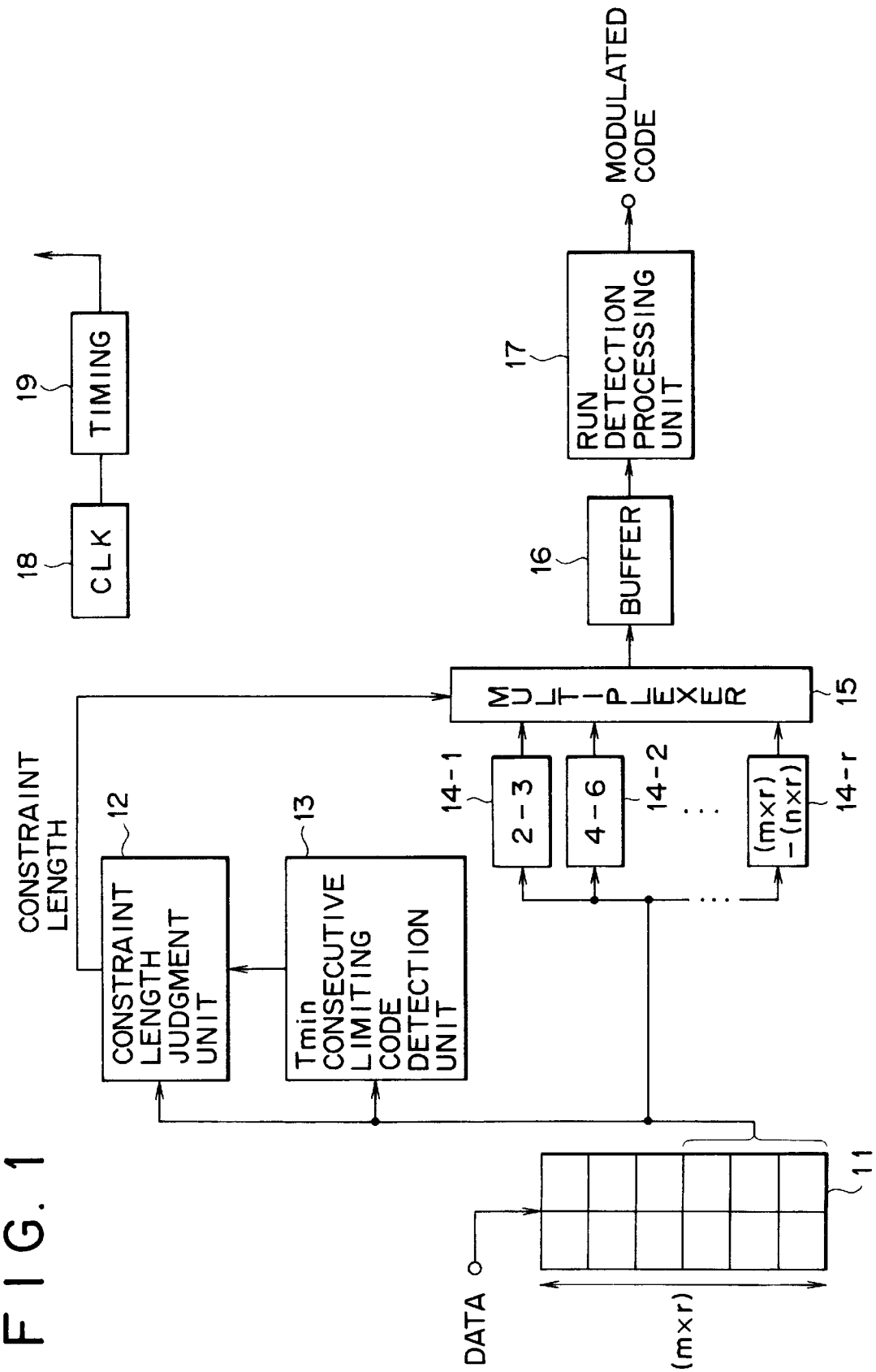
FIG. 1 is a block diagram for illustrating an exemplary structure of one embodiment of a modulation device of the present invention.

Embodiments of a modulation device of the present invention will be described hereinafter in detail with reference to the drawings. An embodiment is an example of an modulation device for converting a data having a m bit basic data length to a variable length code (d, k; m, n; r), and FIG. 1 shows an detailed circuit structure. In this embodiment, data having a basic data length of 2 bit is converted to a variable length code (1, 7; 2, 3; 3) using a conversion table containing a code for limiting consecution of a prescribed consecutive repetition of the minimum run of a channel bit string of RLL (1–7) code.

Assuming, for example, that the variable length code (d, k; m, n; r) is a variable length code (1, 7; 2, 3; 3), that is, d or the minimum run of 0 is 1 bit, k or the maximum run of 0 is 7 bits, n or the basic code length is 3 bits, and r or the maximum constraint length is 3 bits, then, for example, a conversion table as shown herein under is applied.

TABLE 9

RML (1, 7; 2, 3; 2)

|       | data   | code        |
|-------|--------|-------------|
| i = 1 | 11     | 00x         |
|       | 10     | 010         |
|       | 01     | 10x         |
| i = 2 | 0011   | 000 00x     |
|       | 0010   | 000 010     |
|       | 0001   | 100 00x     |
|       | 0000   | 100 010     |
| i = 3 | 100110 | 100 000 010 |

The term RML in the above-mentioned RML (1, 7; 2, 3; 3) is the abbreviation of Repeated Minimum runlength Limited code and RML is added to differentiate the variable length code of the present invention from the conventional (1, 7; 2, 3; 3).

A shift register 11 outputs data to a constraint length judgement unit 12, a Tmin consecution limiting code detection unit 13, and all conversion units 14-1 to 14-r with shifting the data 2 bits by 2 bits.

The constraint length judgement unit 12 judges the constraint length of the data and outputs it to a multiplexer 15. The Tmax consecution limiting code detection unit 13 outputs, when the Tmax consecution limiting code detection unit detects the exclusively used code (limiting code), the detected signal to the constraint length judgement unit 12.

When the Tmax consecution limiting code detection unit 13 detects a Tmax consecution limiting code, the constraint length judgement unit 12 judges it to be the previously prescribed exclusively used Tmax consecution limiting code, and outputs the constraint length to the multiplexer 15. When, though the constraint length judgement unit 12 judges a different constraint length depending on the case, the constraint length judgement unit 12 determines the constraint length preferentially based on the output supplied from the Tmax consecution limiting code detection unit 13.

The conversion units 14-1 to 14-r refer to respective built-in conversion tables, judges whether a conversion rule corresponding to the supplied data is registered, and if a corresponding rule is registered, then the data is converted and the converted code is outputted to the multiplexer 15. On the other hand, if a corresponding rule is not registered, then the conversion units 14-1 to 14-r cancel the supplied data.

If an indefinite bit is included in the converted code, the indefinite bit value is replaced with 1, and a code is outputted.

The multiplexer 15 selects the code converted by a conversion unit 14-i which corresponds to the constraint length i supplied from the constraint length judgement unit 12, and outputs the code to a run detection processing unit 17 through a buffer 16 as a serial data.

The run detection processing unit 17 detects a run having a run length (number of consecutive 0) smaller than the minimum run d in the supplied serial data, and converts the prescribed uncertain bit value from "1" to "0".

The run detection processing unit 17 converts all the run length to the run length equal to or longer than the minimum run d (because occurrence of a run larger than the maximum run k is removed, therefore the length of all the runs is equal to or larger than the minimum run d and equal to or smaller than the maximum run k).

A clock circuit (CLK) 18 generates a clock, a timing control unit 19 generates a timing signal synchronous to the clock supplied from the clock circuit 18, and supplies the timing signal to the shift register 11, the constraint length judgement unit 12, the Tmax consecution limiting code detection unit 13, and the buffer 16.

Figure 2:
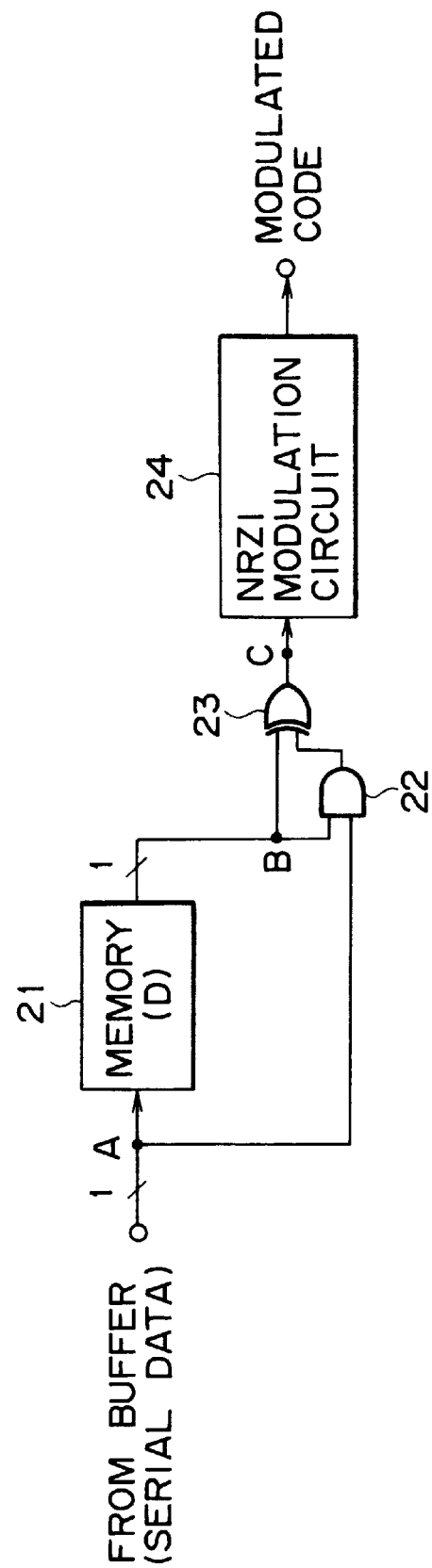
FIG. 2 is a block diagram for illustrating an exemplary structure of a run detection processing unit shown in FIG. 1.

FIG. 2 shows an embodiment of the run detection processing unit 17. In this embodiment, a run having a smaller length than the minimum run d (=1) in RML (1–7) (namely run length of 0) is detected.

A memory 21 holds 1 bit of the serial data supplied from the buffer 16 for 1 clock duration and then outputs it. An AND circuit 22 calculates a logical product of the serial data supplied from the buffer 16 and the serial data supplied before 1 clock outputted from the memory 21, and outputs the calculation result to the one input terminal of an XOR (exclusive OR) circuit 23.

The XOR circuit 23 calculates an exclusive OR of the data supplied from the AND circuit 22 and the data supplied from the memory 21, and outputs the calculation result to an NRZI modulation circuit 24.

The NRZI modulation circuit 24 NRZI-modulates the bit string supplied from the XOR circuit 23 and outputs the NRZI-modulated code as a modulated code.

The NRZI modulation circuit 24 may be replaced with a circuit for modulating codes based on other modulation systems as required. Alternatively, for example, in the method that a bit string modulated to a RLL code is recorded as it is without NRZI modulation as in the case of an magneto-optic disc of ISO standard, the NRZI modulation circuit 24 is unnecessary, the output from the XOR circuit 23 is outputted from the run detection processing unit 17 as a modulated code.

Next, operations of this embodiment is described.

First, data is supplied from the shift register 11 to the respective conversion units 14-1 to 14-r, the constraint length judgement unit 12, and the Tmax consecution limiting code detection unit 13 in 2 bit unit.

The constraint length judgement unit 12 has a built-in conversion table shown in Table 9, and judges the constraint length i of the data with reference to the conversion table, and outputs the judgement result (constraint length i) to the multiplexer 15.

The Tmax consecution limiting code detection unit 13 has an built-in limiting code portion (the portion to convert the data "100110" of i=3 in Table 9) in the conversion table shown in Table 9, and when the Tmax consecution limiting code detection detects a Tmax consecution limiting code ("100110") with reference to the conversion table, outputs the detection signal to the constraint length judgement unit 12.

When the constraint length judgement unit 12 has received a detection signal from the Tmax consecution limiting code detection unit 13, if the constraint length judgement unit 12 has judged another constraint length, the constraint length judgement unit does not select the another constraint length, but select the detection signal from the Tmax consecution limiting code detection unit 13, judges it to be the constraint length based on the Tmax consecution limiting code, and outputs the constraint length to the multiplexer 15.

Figure 3:
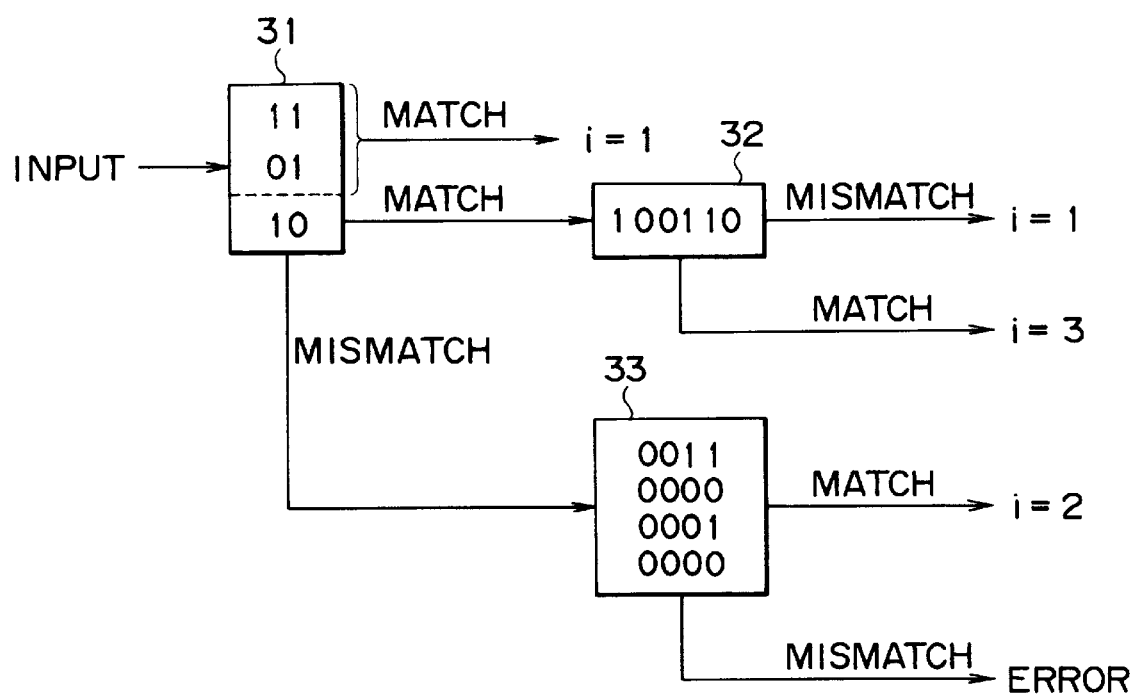
FIG. 3 is a diagram for describing operations of a constraint length judgement unit shown in FIG. 1.

FIG. 3 shows a diagram for describing operations of the constraint length judgement unit 12. The constraint length judgement unit 12 has the built-in table shown in Table 9, and a judgement unit 31 judges whether the input data is coincident with any one of "01", "10", and "11". If the input data is coincident with any one of "01" and "11", then the judgement unit 31 judges the constraint length i to be 1. On the other hand, if the input data is coincident with "10", the Tmax consecution limiting code detection unit 13 judges the data to be coincident with "100110" (limiting code) with extension of the later 4 bits in addition to the first 2 bits, and when the input data is not "1100110" after all, then the judgement unit 32 judges the constraint length i to be 1. On the other hand, if the input data is "100110", the judgement unit 32 judges the constraint length i to be not 1, but to be 3. Further, if the input data is not coincident with any one of "01", "10", and "11", then the judgement unit 33 judges whether the input data is coincident with any one of "0011", "1001", "0001, and "0000".

If the input data is coincident with any one of "0011", "1001", "0001", and "0000", then the judgement unit 33 judges the constraint length i to be 2. When the judgement is not performed, it means that the input data is not coincident with any one of bit strings having the constraint length of 1 to 3, the operation results in an error.

The constraint length judgement unit 12 outputs the constraint length i judged as described herein above to the multiplexer 15.

Figure 4:
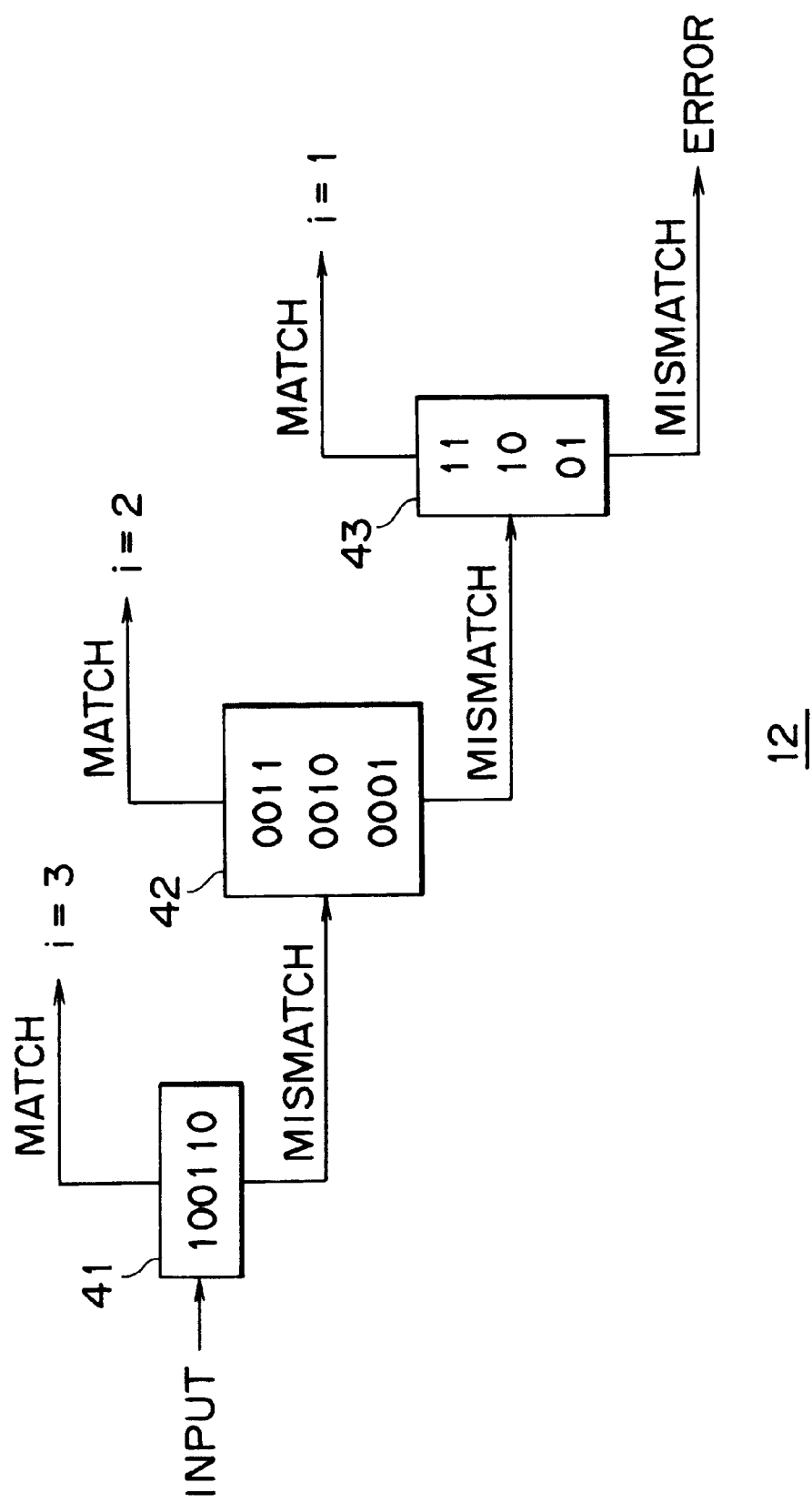
FIG. 4 is a diagram for describing operations of the constraint length judgement unit shown in FIG. 1.

The constraint length judgement unit 12 may process the constraint length judgement in the order of a pattern from i=3, to i=2, and i=1 as shown in FIG. 4.

In this case, the judgement unit 41 judges first whether the input data is coincident with "100110", if the result is YES, then the constraint length i is judged to be 3. If the result is NO, then the judgement unit 42 judges whether the input data is coincident with any one of "0011", "0010", and "0001". If the result is YES, then the constraint length i is judged to be 2.

If the result is NO, the judgement unit 43 judges whether the input data is coincident with any one of "11", "10", and "01", and if the result is YES, the constraint length i is judged to be 1, on the other hand, if the result is NO, then the constraint length i is judged to be an error.

On the other hand, the conversion units 14-1 to 14-r have respectively a table corresponding to each constraint length i. If a conversion rule corresponding to the supplied data is registered in the table, the supplied 2×i bits data is converted to a 3×i bit code using the conversion rule, and if the converted code contains a uncertain bit, the uncertain bit value is set to 1, and the code is outputted to the multiplexer 15.

The multiplexer receives the code from the conversion unit 14-i which corresponds to the constraint length i supplied from the constraint length judgment unit 12, and outputs the code to the run detection processing section 17 through buffer 16 as a serial data.

The run detection processing section 17 detects a run smaller than the minimum run d (=1) in the supplied serial data, converts the uncertain pit value adjacent to the head of the run from "1" to "0", NRZI-modulates it, and outputs the NRZI-modulated code as a modulated code.

As described herein above, once all the uncertain pit values are set to 1, then a run smaller than the minimum run d (=1) is detected, uncertain pit values located adjacent to the head of the run are converted from "1" to "0", and thus the uncertain bit value is corrected.

In the run detection processing unit 17 shown in FIG. 2, the supplied data (1 bit) value is stored in the memory 21 during 1 clock, and if both the bit value (A in FIG. 2) to be supplied next and the output supplied from the memory 21 (B in FIG. 2) (consecutive two bit values) are "1", then the run detection processing unit 17 outputs "0" from the logic circuit comprising the AND circuit 22 and XOR circuit 23 as shown in the table of truth value of FIG. 5, on the other hand, if B is 0 or B is 1 and A is 0, then the urn detection processing unit 17 outputs the output value (B) of the memory 21 as it is (C in FIG. 2).

By operations as described herein above, when "1" is consecutive in the supplied serial data (that is, when the run length is 0), the precedent "1" is converted to "0", all the run lengths become 1 or larger.

The NRZI modulation circuit 24 performs NRZI modulation on the supplied serial data, and outputs the modulated data as a modulated code.

When the data is inputted as described herein above, first the constraint length i of the data is judged, and converted to a code correspondingly to the constraint length i, and when converted, the uncertain pit value is temporarily set to "1" if an uncertain pit is contained. Next, a run smaller than the minimum run d is detected, and the uncertain pit value which is adjacent to the head of the run is converted from "1" to "0" to correct the uncertain bit value.

In table 9, if the conversion table of i=3 (conversion table of a limiting code) is not available, for example, when data "001001100110010010" is inputted, "0010" at the head is converted to "000010" as shown in FIG. 6 as a code A of i=2. The following "01", "10", "01", "10", "01" are converted respectively to "10x", "010", "10x", "010", and "10x" corresponding to the conversion table of i=1. "0010" at the tail is converted to a code "000010" as data of i=2. Because x is determined as "1" or "0" so as to be the minimum run and the maximum run, all the x's are converted to 1.

The code generated as described herein above is converted to a signal having a logic which is inverted at the timing of "1" by, for example, NRZI-modulation, therefore this code A is a code in which 2T minimum inversion interval repeats 8 times consecutively.

In the case that the conversion table of i=3 in Table 9 is used, "100110" is judged to be a limiting code among data, and is therefore converted to a limiting sign "100000010". As the result, the code B shown in FIG. 6 is obtained, and long consecution of the minimum inversion interval Tmin is prevented. In the case of Table 9, the longest consecutive minimum inversion interval Tmin is 5, and will not be 6 or longer.

The limiting code "100110" is converted to a limiting code "100000010" depending on the case, however alternatively, may be converted to "10", "01", and "10" 10" and then to "010101010". In either way, the rule of the maximum run d and minimum run k holds.

Figure 7:
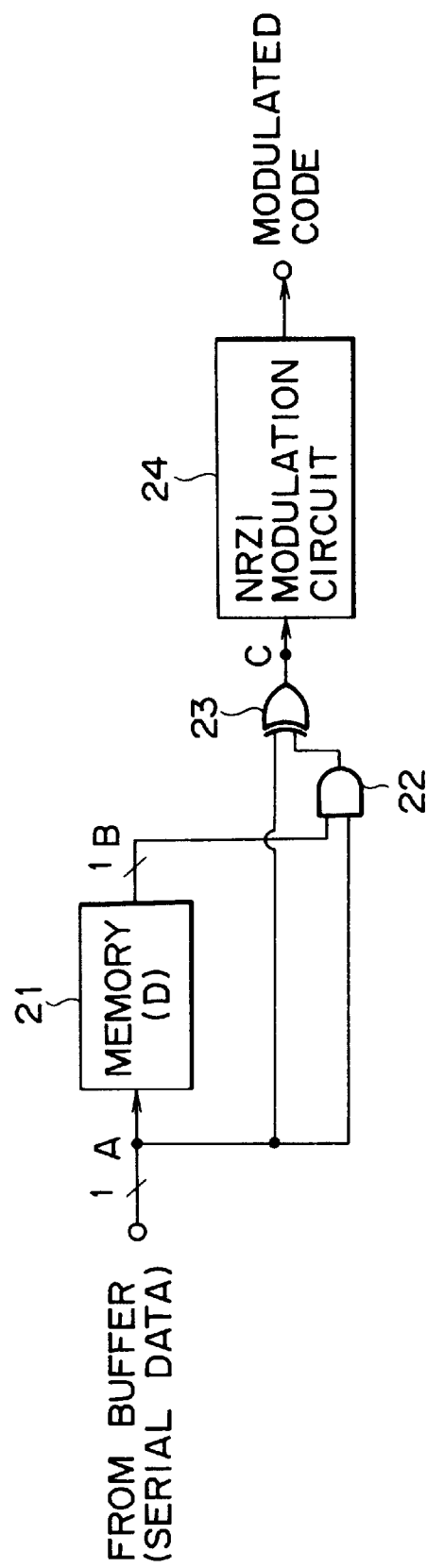
FIG. 7 is a block diagram for illustrating another exemplary structure of the run detection processing unit shown in FIG. 1.

In the embodiment described herein above, modulation to RML (1–7) code shown in Table 9 is described, however alternatively the present invention can be applied to modulation to codes other than that shown in Table 9. For example, in modulation to alternative RML (1–7) codes shown FIG. 10, FIG. 11, or FIG. 12, the portion of each constraint length i shown in Fig. Table 10, Table 11, or Table 12 is held in the modulation device shown in FIG. 1, the uncertain bit value is set to 1 after conversion, the run smaller than the minimum run is detected by the run detection processing unit 17, and the prescribed uncertain bit value is converted to 0. In the example in Table 10 and Table 12, the run detection processing unit 17 changes the one input to the XOR circuit 23 shown in FIG. 2 to the input to the memory 21 instead of the output of the memory 21 as shown in FIG. 7, and the uncertain bit value which is adjacent to the head of the run is converted to 0. In the example of Table 11, the uncertain bit value which is adjacent to the tail of the run is converted to 0.

The embodiment shown in FIG. 1 can be applied as it is with only changing the conversion table or inverse conversion table from Table 9 to Table 10, Table 11, or Table 12.

TABLE 10

RML (1, 7; 2, 3; 3)

|       | data   | code        |
|-------|--------|-------------|
| i = 1 | 11     | x00         |
|       | 10     | 010         |
|       | 01     | x01         |
| i = 2 | 0011   | x00 000     |
|       | 0010   | 010 000     |
|       | 0001   | x00 001     |
|       | 0000   | 010 001     |
| i = 3 | 100110 | 010 000 001 |

The constraint length r is 3.

TABLE 11

RML (1, 7; 2, 3; 3)

|       | data   | code        |
|-------|--------|-------------|
| i = 1 | 00     | 00x         |
|       | 01     | 010         |
|       | 10     | 10x         |
| i = 2 | 1100   | 000 010     |
|       | 1101   | 000 00x     |
|       | 1110   | 100 010     |
|       | 1111   | 100 00x     |
| i = 3 | 100110 | 100 000 010 |

The constrant length r is 3.

TABLE 12

RML (1, 7; 2, 3; 3)

|       | data   | code        |
|-------|--------|-------------|
| i = 1 | 00     | x00         |
|       | 01     | 010         |
|       | 10     | x01         |
| i = 2 | 1100   | 010 000     |
|       | 1101   | x00 000     |
|       | 1110   | 010 001     |
|       | 1111   | x00 001     |
| i = 3 | 100110 | 010 000 001 |

The constraint length r is 3. These Tables 9 to 12 are tables corresponding to conventional Tables 1 to Table 4.

FIGS. 8 to 10 show that long consecution of the minimum inversion interval is prevented when the conversion table listed in Tables 10 to 12 are used. The same operations are involved as shown in FIG. 6, and description is omitted.

The longest consecution of the minimum inversion interval is 5 and not 6 or longer when a conversion table shown in Tables 10 to 12 is used.

In Tables 9 to 12, "100110" is specified as the Tmax consecution limiting code of the constraint length i=3, however alternatively, for example, the portion of the constraint length i=3 of Table 9 maybe replaced with "011001" as shown in Table 13 to obtain the same result.

The embodiment shown in FIG. 1 can be applied as it is with changing the conversion table or inverse conversion table from Table 9 to Table 13.

TABLE 13

RML (1, 7; 2, 3; 3)

|       | data   | code        |
|-------|--------|-------------|
| i = 1 | 11     | 00x         |
|       | 10     | 010         |
|       | 01     | 10x         |
| i = 2 | 0011   | 000 00x     |
|       | 0010   | 000 010     |
|       | 0001   | 100 00x     |
|       | 0000   | 100 010     |
| i = 3 | 011001 | 100 000 010 |

As shown, for example, in Table 14 namely the table which is Table 14 having the added code, the addition of the Tmax consecution limiting code at the constraint length i=4 gives the same result.

The embodiment shown in FIG. 1 can be applied as it is with only changing the conversion table or inverse conversion table from Table 9 to Table 14.

TABLE 14

RML (1, 7; 2, 3; 4)

| | data | code |
|---|---|---|
| i = 1 | 11 | 00X |
| | 10 | 010 |
| | 01 | 10x |
| i = 2 | 0011 | 000 00x |
| | 0010 | 000 010 |
| | 0001 | 100 00x |
| | 0000 | 100 010 |
| i = 3 | 100110 | 100 000 010 |
| i = 4 | 01100111 | 001 000 000 010 |
| | 01100110 | 100 000 001 00x |
| | 01100101 | 101 000 000 010 |
| | 01100100 | 100 000 001 010 |

A plurality of modulation code patterns for limiting consecution of Tmin may be used as long as the modulation code pattern is a pattern which can modulate uniquely when modulated. For example as shown in Table 14, Tmin consecution may be limited by making the constraint length longer. As described herein above, a table which has an alternative limiting code can be prepared.

FIG. 11 and FIG. 12 show prevention of long minimum inversion interval consecution using a conversion table respectively of Table 13 and Table 14. The same operations are involved in as shown in FIG. 6, and description is omitted.

The longest consecution of the minimum inversion interval in using a conversion table shown in Table 13 and Table 14 is 5 and will not be 6 or longer.

The limiting sign string "100 000 010" converted from the Tmin consecutive limiting data string of the constraint length i=3 in Table 9 is described herein under. This limiting sign string has a code pattern which has not been contained in the conventional conversion code string (i=1 or i=2). This code pattern is used also for modulation. For modulation, the rule of the minimum run d=1 and maximum run k=7 remains effective.

The rule of the maximum run k should not necessarily be effective because the maximum run k is independent from recording/reproduction though the rule of the minimum run d should be effective because the minimum run d of a code string is dependent on recording/reproduction.

In the case that the rule of the maximum run k should not be effective, the converted limiting sign word keeps to the rule of the minimum run d=1 in the Tmin consecution conversion, and a code pattern which is not found in the conventional conversion code string may be selected. In such operation, 6 selectable limiting sign patterns are listed herein under.

"000 000 000" limiting sign pattern (1)
"000 000 001" limiting sign pattern (2)
"000 000 010" limiting sign pattern (3)
"100 000 000" limiting sign pattern (4)
"100 000 001" limiting sign pattern (5)
"100 000 010" limiting sign pattern (6)

In Table 9, the limiting sign pattern (6) which keeps to the rule of the minimum run d=1 and the maximum run k=7 is used among the limiting sign patterns (1) to (6).

Limiting sign patterns (1) to (5) are rewritten as described herein under.

"000 000 00x" limiting sign pattern (A)
"000 000 010" limiting sign pattern (B)
"100 000 00x" limiting sign pattern (C)

Herein a symbol x in limiting sign patterns is 0 or 1.

In the conversion table or inversion conversion table which uses the limiting sing pattern (A), (B), or (C), the rule of the minimum run d=1 is effective, and the rule of the maximum run k=7 is not effective. An example of a table in which the conversion code i=3 in Table 9 is replaced with the limiting sign pattern (A) is shown in Table 15.

TABLE 15

RML (1, 7; 2, 3; 3)

| | data | code |
|---|---|---|
| i = 1 | 11 | 00x |
| | 10 | 010 |
| | 01 | 10x |
| i = 2 | 0011 | 000 00x |
| | 0010 | 000 010 |
| | 0001 | 100 00x |
| | 0000 | 100 010 |
| i = 3 | 011001 | 000 000 00x |

When the above-mentioned description is applied to Table 10, if the limiting sign pattern of i=3 in Table 10 is "010 000 001", then the rule of the minimum run d=1 and the maximum run k=7 is effective, on the other hand, if the conversion table or inverse conversion table which uses the limiting sign pattern (D) (E), or (F) described herein under is used, the rule of the minimum run d=1 is effective and the rule of the maximum run k=7 is not effective.

"x00 000 000" limiting sign pattern (D)
"010 000 000" limiting sign pattern (E)
"x00 000 001" limiting sign pattern (F)

Further, in the case that, for example, modulation to RML (1–6) code shown in Table 16 or Table 17 is performed as modulation to codes other than the above-mentioned codes, the portion of each constraint length i of Table 16 or Table 17 is held in the conversion unit 14-i of the modulation device shown in FIG. 1, the uncertain bit value is set to 1 after conversion, the run which is smaller than the minimum run is detected by the run detection processing unit 17, and the prescribed uncertain bit value is changed to 0. In the example of Table 16, the run detection processing unit 17 changes the uncertain bit value which is adjacent to the tail of the run is set to 0 as shown in FIG. 2. In the example of Table 17, the uncertain bit value which is adjacent to the head of the run is set to 0 as shown in FIG. 7.

In the case of using the RML (1–6) code shown in Table 16, data having a basic data length of 2 bits is converted to a table which contains a code for limiting consecutive length of the minimum run to a prescribed consecution length in a channel bit string of the RML (1–6) code, namely a variable length code (1, 6; 2, 3; 5) in the table.

Assuming that the variable length code (d, k; m, n; r) is, for example, the variable length code (1, 6; 2, 3; 5), namely, the 0 minimum run d of 1 bit, the 0 maximum run k of 6 bits, the basic data length m of 2 bits, the basic code length n of 3 bits, and the maximum constraint length r of 5 bits, then a conversion table as shown in Table 16 is used as the conversion table. Similarly a conversion table of inverse channel bit data is shown in Table 17.

TABLE 16

RML (1, 6; 2, 3; 5)

| | data | code |
|---|---|---|
| i = 1 | 11 | 10x |
| | 10 | 010 |
| | 01 | 00x |
| i = 2 | 0011 | 100 010 |
| | 0010 | 100 00x |
| | 0001 | 000 010 |
| i = 3 | 000011 | 000 001 010 |
| | 000010 | 000 001 00x |
| | 000001 | 100 000 010 |
| i = 4 | 00000011 | 000 001 000 010 |
| | 00000010 | 000 001 000 00x |
| | 00000001 | 101 000 000 10x |
| | 00000000 | 001 000 000 10x |
| i = 5 | 1011101110 | 001 000 000 100 010 |
| | 1110111011 | 101 000 000 100 010 |
| | 1110111000 | 101 000 000 100 00x |

The constraint length r is 5.

TABLE 17

RML (1, 6; 2, 3; 5)

| | data | code |
|---|---|---|
| i = 1 | 11 | x01 |
| | 10 | 010 |
| | 01 | x00 |
| i = 2 | 0011 | 010 001 |
| | 0910 | x00 001 |
| | 0001 | 010 000 |
| i = 3 | 000011 | 010 100 000 |
| | 000010 | x00 100 000 |
| | 000001 | 010 000 001 |
| i = 4 | 00000011 | 010 000 100 000 |
| | 00000010 | x00 000 100 000 |
| | 00000001 | x01 000 000 101 |
| | 00000000 | x01 000 000 100 |
| i = 5 | 1011101110 | 010 001 000 000 100 |
| | 1011101100 | 010 001 000 000 101 |
| | 1110111011 | x00 001 000 000 101 |

The constraint length r is 5.

In Table 16 and Table 17, a plurality of three patterns of Tmin consecution limiting code are given for the constraint length i=5, these patterns are the pattern which is possible to modulate uniquely when modulated. As the result, consecution of Tmin is limited to a finite length though consecution of Tmin is not limited in using conventional RLL (1, 6). The given three patterns relates to the maximum length of Tmin consecution.

For example, in Table 16, if the portion of the constraint length i=5 is given as described herein under,
i=5 1011101110 001 000 000 100 010
1110111011 101 000 000 100 010
1110111000 101 000 000 100 00x
the length of Tmin consecution is limited, the maximum length of Tmax consecution is 7. If only,
i=5 1011101110 001 000 000 100 010
is available, then the longest Tmin consecution is 9 though the Tmin consecution length is limited.
Further, only,
i=5 1110111011 101 000 000 100 010
1110111000 101 000 000 100 00x
are available, then the longest Tmin consecution is 8 though the Tmin consecution length is limited.

The same is true for Table 17.

Limitation of the minimum inversion interval consecution length for the conversion table shown in Table 16 is shown in FIG. 13. Limitation of the minimum inversion interval consecution length for the conversion table shown in Table 17 is shown in FIG. 14.

In the case of using the RML (1–6) code shown in Table 18, data having a basic data length of 2 bits is converted to a table which contains a code for limiting consecution of the minimum run to a prescribed consecution length in a channel bit string of the RML (1–6) code, namely a variable length code (1, 6; 2, 3; 6) in the table.

Assuming that the variable length code (d, k; m, n; r) is, for example, the variable length code (1, 6; 2, 3; 6), namely, the 0 minimum run d of 1 bit, the 0 maximum run k of 6 bits, the basic data length m of 2 bits, the basic code length n of 3 bits, and the maximum constraint length r of 6 bits, then a conversion table as shown in Table 16 is used as the conversion table. Similarly a conversion table of inverse channel bit data is shown in Table 18.

TABLE 18

RML (1, 6; 2, 3; 5)

| | data | code |
|---|---|---|
| i = 1 | 11 | 10X |
| | 10 | 010 |
| | 01 | 00x |
| i = 2 | 0011 | 100 010 |
| | 0010 | 100 00x |
| | 0001 | 000 010 |
| i = 3 | 000011 | 000 001 010 |
| | 000010 | 000 001 00x |
| | 000001 | 100 000 010 |
| i = 4 | 00000011 | 000 001 000 010 |
| | 00000010 | 101 000 000 10x |
| | 00000001 | 001 000 000 10x |
| i = 5 | 0000000011 | 101 000 000 100 010 |
| | 0000000010 | 101 000 000 100 00x |
| | 0000000001 | 001 000 000 100 010 |
| | 0000000000 | 001 000 000 100 00x |
| i = 6 | 101110111011 | 101 000 000 100 000 010 |
| | 111011101110 | 001 000 000 100 000 010 |

The constraint length r is 6.

Even though bit shift error happens to occur, Table 18 will prevent infinite consecution of error when modulated in the same way as in the case of Table 7.

The longest consecution of the minimum inversion interval in using the conversion table shown in Table 18 is 10 and will not be 11 or longer.

Limiting of the minimum inversion interval consecution length in using the conversion table of Table 18 is shown in FIG. 15.

Further, in the case that, for example, modulation to RML (2–7) code shown in Table 19 is performed as modulation to codes other than the above-mentioned codes, the portion of each constraint length i of Table 19 is held in the conversion unit 14-i of the modulation device shown in FIG. 1. Because there is no uncertain bit in RML (2–7) code, the run detection processing unit 17 is omitted from the modulation device shown in FIG. 1, and the shift register is operated on alternate bits. The same basic operation is involved as shown in FIG. 1, and the description is omitted.

TABLE 19

RML (2, 7; 1, 2; 4)

| | data | code |
|---|---|---|
| i = 1 | 11 | 1000 |
| | 10 | 0100 |

TABLE 19-continued

RML (2, 7; 1, 2; 4)

|  | data | code |
|---|---|---|
| i = 2 | 011 | 001000 |
|  | 010 | 100100 |
|  | 000 | 000100 |
| i = 3 | 0011 | 00001000 |
|  | 0010 | 00100100 |
| i = 4 | 01001 | 0000100100 |

Figure 17:
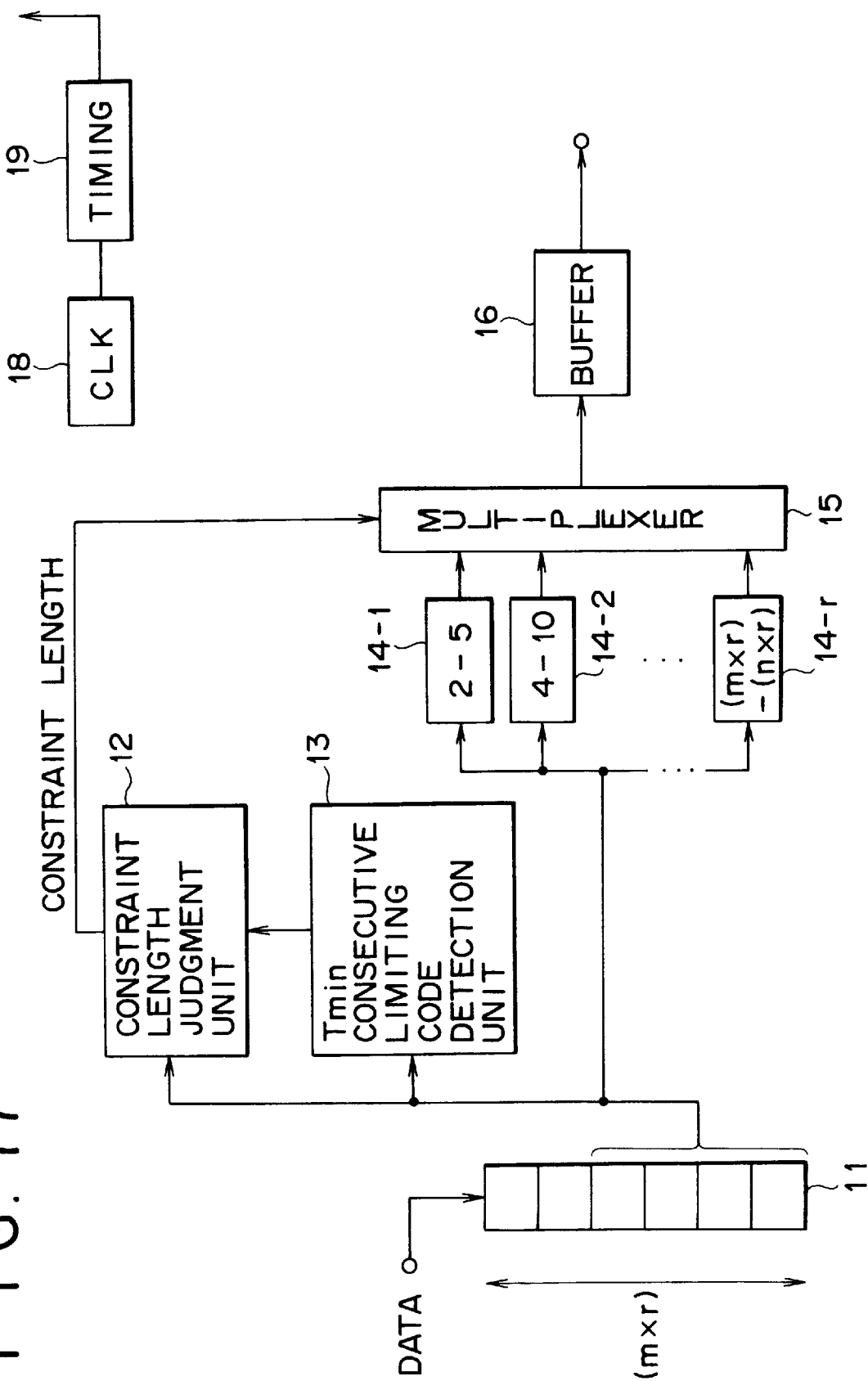
FIG. 17 is a block diagram for illustrating an exemplary structure of yet another embodiment of a modulation device of the present invention.

Limiting of the minimum inversion interval consecution length in using the conversion table shown in Table 19 is shown in FIG. 17. In this example, as shown in FIG. 17, the data is converted to the code A in the unit of i=2 if the limiting code is not provided, on the other hand, if conversion is performed using Table 19 in which the limiting code is provided, as shown as the code B, the first data "01001" is converted to a limiting sign "000100100" as the data of i=4, and the next data "0010" is converted to a limiting code "00100100" as the data of i=3. The final data "010" is converted to a limiting code "100100" as the data of i=2 in the same way as in the code A.

When modulation to RML-VFM code shown in Table 20 shown herein under is performed similarly, limitation of the minimum inversion interval consecution length is shown in FIG. 17. The basic operation is the same as that shown in FIG. 1 and FIG. 16, and the description is omitted.

Herein if the conversion code
"*RML-code
1010101010 00001 00001 00001 00001 00000",
of the conversion table r=5 in the Table 20 is omitted, a normal VFM code (Variable Five Modulation) table which does not limit the minimum run consecution is obtained. In detail, the parameter of the conventional VFM is VFM (4, 22; 2, 5; 5), the parameter of RML-VFM in Table 20 is RML-VFM (4, 22; 2, 5; 5), and the maximum constraint length r is both 5.

In detail, In the case of a code having sufficient conversion codes in the maximum conversion table such as VFM code, the excessive conversion code may be allocated to a conversion code for limiting the minimum run consecution, in such case it is not required to increase the maximum constraint length r.

As the result, when the conversion code for limiting the minimum run consecution is allocated, the maximum constraint length r may be increased as required.

TABLE 20

RML-VFM (4, 22; 2, 5; 5)

| 11 | 00000 |
|---|---|
| 10 | 10000 |
| 111111 = | 00001 00001 00000 |
| 0111 | 01000 00000 |
| 0110 | 00100 00000 |
| 0101 | 00010 00000 |
| 0100 | 00001 00000 |
| 001111 | 01000 010000 0000 |
| 001110 | 01000 00100 00000 |
| 001101 | 01000 00010 00000 |
| 001100 | 01000 00001 00000 |
| 001011 | 00010 00001 00000 |
| 001010 | 00100 00100 00000 |
| 001001 | 00100 00010 00000 |
| 001000 | 00010 00001 00000 |
| 00011 | 00010 00010 00000 |

TABLE 20-continued

RML-VFM (4, 22; 2, 5; 5)

| 00011011 | 01000 01000 01000 00000 |
|---|---|
| 00011010 | 01000 01000 00100 00000 |
| 00011001 | 01000 01000 00010 00000 |
| 00011000 | 01000 01000 00001 00000 |
| 00010111 | 01000 00010 00001 00000 |
| 00010110 | 01000 00100 00100 00000 |
| 00010101 | 01000 00100 00010 00000 |
| 00010100 | 01000 00100 00001 00000 |
| 00010011 | 01000 00010 00010 00000 |
| 00010010 | 00100 00100 00100 00000 |
| 00010001 | 00100 00100 00010 00000 |
| 00010000 | 00100 00100 00001 00000 |
| 00001111 | 00010 00001 00001 00000 |
| 00001110 | 00100 00001 00001 00000 |
| 00001101 | 00100 00010 00010 00000 |
| 00001100 | 00100 00010 00001 00000 |
| 00001011 | 01000 00001 00001 00000 |
| 00001010 | 00001 00001 00001 00000 |
| 00001001 | 00010 00010 00010 00000 |
| 00001000 | 00010 00010 00001 00000 |
| 0000011111 | 01000 01000 01000 00100 00000 |
| 0000011110 | 01000 01000 01000 00100 00000 |
| 0000011101 | 01000 01000 01000 00010 00000 |
| 0000011100 | 01000 01000 01000 00001 00000 |
| 0000011011 | 01000 01000 00010 00001 00000 |
| 0000011010 | 01000 01000 00100 00100 00000 |
| 0000011001 | 01000 01000 00100 00010 00000 |
| 0000011000 | 01000 01000 00100 00001 00000 |
| 0000010111 | 01000 01000 00010 00010 00000 |
| 0000010110 | 01000 00100 00100 00100 00000 |
| 0000010101 | 01000 00100 00100 00010 00000 |
| 0000010100 | 01000 00100 00100 00001 00000 |
| 0000010011 | 01000 00010 00001 00001 00000 |
| 0000010010 | 01000 00100 00001 00001 00000 |
| 0000010001 | 01000 00100 00010 00010 00000 |
| 0000010000 | 01000 00100 00010 00001 00000 |
| 0000001111 | 01000 01000 00001 00001 00000 |
| 0000001110 | 01000 00001 00001 00001 00000 |
| 0000001101 | 01000 00010 00010 00010 00000 |
| 0000001100 | 01000 00010 00010 00001 00000 |
| 0000001011 | 00100 00100 00010 00010 00000 |
| 0000001010 | 00100 00100 00100 00100 00000 |
| 0000001001 | 00100 00100 00100 00010 00000 |
| 0000001000 | 00100 00100 00100 00001 00000 |
| 0000000111 | 00100 00100 00010 00001 00000 |
| 0000000110 | 00100 00100 00001 00001 00000 |
| 0000000101 | 00100 00010 00010 00010 00000 |
| 0000000100 | 00100 00010 00010 00001 00000 |
| 0000000011 | 00100 00001 00001 00001 00000 |
| 0000000010 | 00100 00010 00001 00001 00000 |
| 0000000001 | 00010 00010 00010 00010 00000 |
| 0000000000 | 00010 00010 00010 00001 00000 |
| 1010101010 | 00001 00001 00001 00001 00000 (*RML-code) |

Liming of the minimum inversion interval consecution length in using the conversion table shown in Table 20 is shown in FIG. 19. As shown in FIG. 19, in this example, the data "10", of i=1 is converted to a code A of "10000" when the limiting code is not provided, on the other hand, when the data is converted using Table 20 which is provided with the limiting code, as shown as the code B, the data "1010101010" of i=5 is converted to a code "00001 00001 00001 00001 00000". As described herein above, by adding the code for limiting the minimum run consecution as shown in Table 20, a code which causes the infinitely consecutive minimum run d=4 namely "5T" is converted to a code having the limited longest minimum run consecution of 3.

Next, the modulation result for converting consecutive Tmin to a limiting code is summarized herein under. A simulation result of the Tmin consecution distribution obtained when a random data of 13107200 bits prepared arbitrarily is modulated using three modulation code tables is shown herein under. The conventional Tmin consecution length, which can be consecutive infinitely, is shortened effectively.

The result obtained by modulating the data using the table of RML (1, 7; 2, 3; 3) shown in Table 9 is shown herein under. It is confirmed that the size of the modulated data is 19660782 channel bit data, Tmin is 2T, and Tmax is 8T. Further, it is confirmed that 1:1 demodulation according to Table 11 is performed.

The frequency of consecutive 2T is shown herein under.

| 1-consecution | 897769 | 2-consecution | 354625 |
|---|---|---|---|
| 3-consecution | 122242 | 4-consecution | 30117 |
| 5-consecution | 4316 | 6-consecution | 0 |
| 7-consecution | 0 | 8-consecution | 0 |
| 9-consecution | 0 | | |

The maximum-consecution length is 5.

Next, the frequency of consecutive 2T for the same random data in the case that RLL (1, 7; 2, 3; 2) in Table 1 does not limit the Tmin-consecution of Table 9 is shown herein under.

| 1-consecution | 866035 | 2-consecution | 342859 |
|---|---|---|---|
| 3-consecution | 136063 | 4-consecution | 53908 |
| 5-consecution | 21486 | 6-consecution | 8602 |
| 7-consecution | 3366 | 8-consecution | 1376 |
| 9-consecution | 572 | 10-consecution | 216 |
| 11-consecution | 101 | 12-consecution | 32 |
| 13-consecution | 13 | 14-consecution | 7 |
| 15-consecution | 3 | 16-consecution | 4 |
| 17-consecution | 1 | 18-consecution | 1 |
| 19-consecution | 0 | 20-consecution | 0 |
| 21-consecution | 0 | | |

The maximum 2T consecution is 18. Based on this fact, it is confirmed that the code for limiting Tmin consecution in Table 9 is effective.

Results for Tables 10, 11, 12, 13, 14, and 15 are omitted because the structure of these tables is similar to that of Table 9 and will give the same results.

The result of modulation of the data using the table RML (1, 6; 3, 3; 5) shown in Table 16 is shown herein under. It is confirmed that the size of the data is 19660782 channel bits, Tmin is 2T, and Tmax is 7T. Further, it is confirmed that 1:1 demodulation according to Table 14 is performed.

The frequency of consecutive 2T is shown herein under.

| 1-consecution | 878768 | 2-consecution | 347418 |
|---|---|---|---|
| 3-consecution | 137343 | 4-consecution | 54523 |
| 5-consecution | 20441 | 6-consecution | 4439 |
| 7-consecution | 224 | 8-consecution | 0 |
| 9-consecution | 0 | | |

The longest consecution is 7.

Next, the frequency of consecutive 2T for the same random data in the case that RLL (1, 6; 2, 3; 4) in Table 5 does not limit the Tmin-consecution of Table 16 is shown herein under.

| 1-consecution | 871091 | 2-consecution | 345273 |
|---|---|---|---|
| 3-consecution | 136830 | 4-consecution | 54390 |
| 5-consecution | 21567 | 6-consecution | 8668 |
| 7-consecution | 3471 | 8-consecution | 1298 |
| 9-consecution | 542 | 10-consecution | 213 |
| 11-consecution | 73 | 12-consecution | 39 |
| 13-consecution | 16 | 14-consecution | 3 |
| 15-consecution | 1 | 16-consecution | 0 |
| 17-consecution | 0 | 18-consecution | 0 |
| 19-consecution | 0 | 20-consecution | 0 |
| 21-consecution | 0 | | |

The maximum 2T consecution is 15. Based on this fact, it is found that the code for limiting Tmin consecution according to Table 16 is effective.

Results for Tables 17 and 18 are omitted because the structure of these tables is similar to that of Table 16 and will give the same results.

The result of modulation of the data using the table RLL (2, 7; 1, 2; 4) shown in Table 19 is shown herein under. It is confirmed that the size of the data is 26214376 channel bits, Tmin is 3T, and Tmax is 8T. Further, it is confirmed that 1:1 demodulation according to Table 19 is performed.

The frequency of 3T consecution is shown herein under.

| 1-consecution | 905019 | 2-consecution | 299808 |
|---|---|---|---|
| 3-consecution | 87811 | 4-consecution | 14213 |
| 5-consecution | 0 | 6-consecution | 0 |
| 7-consecution | 0 | 8-consecution | 0 |
| 9-consecution | 0 | | |

The maximum consecution length is 4.

Next, the frequency of consecutive 3T for the same random data in the case that RLL (2, 7; 1, 2; 3) in Table 8 does not limit the Tmin-consecution of Table 19 is shown herein under.

| 1-consecution | 832578 | 2-consecution | 293498 |
|---|---|---|---|
| 3-consecution | 104345 | 4-consecution | 36690 |
| 5-consecution | 13228 | 6-consecution | 4414 |
| 7-consecution | 1509 | 8-consecution | 568 |
| 9-consecution | 199 | 10-consecution | 73 |
| 11-consecution | 22 | 12-consecution | 11 |
| 13-consecution | 5 | 14-consecution | 1 |
| 15-consecution | 0 | 16-consecution | 0 |
| 17-consecution | 0 | 18-consecution | 0 |
| 19-consecution | 1 | 20-consecution | 0 |
| 21-consecution | 0 | | |

The maximum 3T consecution is 19. Based on this fact, it is found that the code for limiting Tmin consecution according to Table 19 is effective.

Because it is possible to limit the minimum run repetition length by applying the present invention as described hereinbefore, following effects are obtained.

In comparison with the conventional case of no limitation of minimum run consecution length, (1) intervals where the reproduction signal level is low is reduced, generation of error due to jitter is reduced, accuracy of waveform processing such as AGC and PLL is improved, and the total performance is improved, and (2) a short pass memory length for Viterbi decoding is acceptable in design, and circuit size can be made small.

As the transmission medium for transmitting a program for performing the above-mentioned processing to users, various recording media such as a magnetic disk, CD-ROM, and solid memory and alternatively communication media such as network and satellite may be used.

According to the modulation device described in claim 1, the modulation method described in claim 24, and transmission medium described in claim 25, because the minimum run d is 1 or larger, and when the minimum run d continues consecutively for a prescribed consecution length in a channel bit string after variable length code conversion, a limiting code for limiting consecution length is allocated additionally, a long consecution of the minimum run d is prevented, and the data is thus reproduced stably.

What is claimed is:

1. A modulation device for converting data having a basic data length of m bits to a variable length code (d, k; m, n; r) having a basic code length of n bits, said modulation device being provided with a conversion means for allocating a limiting code to a limiting sign when the minimum run d of 1 or larger in a channel bit string after variable length code conversion continues consecutively for a prescribed consecution length.

2. A modulation device as claimed in claim 1, wherein said limiting code is allocated by increasing the constraint length r.

3. A modulation device as claimed in claim 1, wherein the number of said limiting codes to be allocated is 1 or larger.

4. A modulation device as claimed in claim 1, wherein said limiting code is allocated without increasing the maximum constraint length r, and the number of limiting code to be allocated is 1 or larger.

5. A modulation device as claimed in claim 1, wherein said limiting code is a code which is replaceable with another code.

6. A modulation device as claimed in claim 1, wherein said limiting code is generated by combining a plurality of codes other than the limiting code or part of the limiting code.

7. A modulation device as claimed in claim 1, wherein said limiting sign is a sign which is distinguishable from other codes when demodulated, and keeps to said minimum run d rule.

8. A modulation device as claimed in claim 1, wherein said limiting sign keeps not necessarily to said maximum run k rule.

9. A modulation device as claimed in claim 1, wherein conversion means which gives the limiting sign for converting said limiting code is omitted from the code word string of said variable length code, such that said limiting sign keeps to the rule of the minimum run d and the maximum run k.

10. A modulation device as claimed in claim 1, wherein said minimum run d is 1, and a limiting code for limiting consecution of the minimum run of said variable length code is allocated additionally when the minimum run continues consecutively for a prescribed consecution length.

11. A modulation device as claimed in claim 10, wherein said variable length code converts the bit of the prescribed position of a code which makes the maximum run k infinite when the code continues consecutively to an uncertain bit, converts the bit of the prescribed position for keeping to the rule of the determined minimum run and maximum run to an uncertain bit, and replaces said uncertain bit with 0 or 1 so as to keep to the rule of the minimum run d and maximum run in the portions precedent to and subsequent to said uncertain bit.

12. A modulation device as claimed in claim 10, wherein said limiting code is allocated by increasing the constraint length r at most by 1.

13. A modulation device as claimed in claim 10, wherein, if the maximum run k is 7, the maximum consecution length of said minimum run d is a finite length of 5 or larger.

14. A modulation device as claimed in claim 10, wherein, if the maximum run k is 7, the maximum constraint length r of said variable length code is 3 or larger.

15. A modulation device as claimed in claim 10, wherein, if the maximum run k is 6, the maximum consecution length of said minimum run d is a finite length of 7 or larger.

16. A modulation device as claimed in claim 10, wherein, if the maximum run k is 6, the maximum constraint length r of said variable length code is 5 or larger.

17. A modulation device as claimed in claim 1, wherein said minimum run d is 2, and a limiting code is allocated for limiting consecution of the minimum run d of said variable length code when the minimum run d continues consecutively for a prescribed consecution length.

18. A modulation device as claimed in claim 17, wherein said limiting code is allocated by increasing the constraint length r at most by 1.

19. A modulation device as claimed in claim 17, wherein, if the maximum run k is 7, the maximum consecution length of said minimum run d is a finite length of "4" or larger.

20. A modulation device as claimed in claim 17, wherein, if the maximum run k is 7, the maximum constraint length r of said variable length code is 4 or larger.

21. A modulation device as claimed in claim 1, wherein said minimum run d is 4, and a limiting code is allocated for limiting the consecution of the minimum run d of said variable length code when the minimum run continues consecutively for a prescribed consecution length.

22. A modulation device as claimed in claim 21, wherein said limiting code is allocated by increasing the constraint length r at most by 1.

23. A modulation device as claimed in claim 21, wherein, if the maximum run k is 22, the maximum consecution length of said minimum run d is a finite length of 3 or larger.

24. A modulation method for converting data having a basic data length of m bits to a variable length code (d, k; m, n; r) having a basic code length of n bits, wherein a limiting code is allocated to a limiting sign for limiting consecution length of the minimum run d of 1 or larger in a channel bit string after conversion of the variable length code when the minimum run of 1 or larger continues consecutively for a prescribed consecution length.

25. A transmission medium for transmitting a program for converting data having a basic data length of m bits to a variable length code (d, k; m, n; r) having a basic code length of n bits, wherein the program for allocating a limiting code to a limiting sign for limiting consecution length of the minimum run of 1 or larger in a channel bit string after conversion of the variable length code when the minimum run d of 1 or larger continues consecutively for a prescribed consecution length.

* * * * *